United States Patent
Lanzieri et al.

(10) Patent No.: US 8,120,066 B2
(45) Date of Patent: Feb. 21, 2012

(54) SINGLE VOLTAGE SUPPLY PSEUDOMORPHIC HIGH ELECTRON MOBILITY TRANSISTOR (PHEMT) POWER DEVICE AND PROCESS FOR MANUFACTURING THE SAME

(75) Inventors: Claudio Lanzieri, Rome (IT); Simone Lavanga, Rome (IT); Marco Peroni, Rome (IT); Antonio Cetronio, Frascati (IT)

(73) Assignee: Selex Sistemi Integrati S.p.A. (IT)

( * ) Notice: Subject to any disclaimer, the term of this patent is extended or adjusted under 35 U.S.C. 154(b) by 0 days.

(21) Appl. No.: 12/444,383

(22) PCT Filed: Oct. 4, 2006

(86) PCT No.: PCT/IT2006/000705
§ 371 (c)(1),
(2), (4) Date: Nov. 30, 2009

(87) PCT Pub. No.: WO2008/041249
PCT Pub. Date: Apr. 10, 2008

(65) Prior Publication Data
US 2010/0102358 A1    Apr. 29, 2010

(51) Int. Cl.
*H01L 29/66* (2006.01)
(52) U.S. Cl. ............... 257/194; 257/192; 257/E29.246; 257/E21.403; 257/172
(58) Field of Classification Search .............. 257/192, 257/194, E29.246, E21.403; 438/172
See application file for complete search history.

(56) References Cited

U.S. PATENT DOCUMENTS

| 2002/0005528 | A1  | 1/2002 | Nagahara |
| 2002/0024057 | A1* | 2/2002 | Inokuchi et al. ............... 257/155 |
| 2003/0122152 | A1* | 7/2003 | Kim et al. ..................... 257/194 |
| 2005/0001235 | A1* | 1/2005 | Murata et al. ................. 257/192 |

FOREIGN PATENT DOCUMENTS

| EP | 0514079      | 11/1992 |
| WO | WO0007248    | 2/2000  |
| WO | WO2004025707 | 3/2004  |
| WO | WO2006098801 | 9/2006  |

OTHER PUBLICATIONS

Int. Sch. Rpt., EP.

* cited by examiner

*Primary Examiner* — Tan N Tran
(74) *Attorney, Agent, or Firm* — The Belles Group, P.C.

(57) ABSTRACT

Disclosed herein is a pseudomorphic high electron mobility transistor (PHEMT) power device (1) including a semi-insulating substrate (2); an epitaxial substrate (3) formed on the semi-insulating substrate (2) a contact layer (19). The contact layer (19) includes a lightly doped contact layer (20) formed on the Schottky layer (18), and a highly doped contact layer (21) formed on the lightly doped contact layer (20) and having a doping concentration higher than the lightly doped contact layer (20). The PHEMT power device (1) further includes a—wide recess (23) formed to penetrate the highly doped contact layer (21) and a narrow recess (24) formed in the wide recess (23) to penetrate the lightly doped contact layer (20). The gate electrode (6) is formed in the narrow recess (24) and in Schottky contact with the Schottky layer (18).

35 Claims, 3 Drawing Sheets

SINGLE VOLTAGE SUPPLY PSEUDOMORPHIC HIGH ELECTRON MOBILITY TRANSISTOR (PHEMT) POWER DEVICE AND PROCESS FOR MANUFACTURING THE SAME

CROSS-REFERENCE TO RELATED PATENT APPLICATIONS

The present application is a U.S. national stage application under 35 U.S.C. §371 of PCT Application No. PCT/IT2006/000705, filed Oct. 4, 2006, the entirety of which is incorporated herein by reference.

TECHNICAL FIELD OF THE INVENTION

The present invention relates in general to a power device, and more particularly to a pseudomorphic high electron mobility transistor (PHEMT) power device and to a process for manufacturing the same.

BACKGROUND ART

As is known, pseudomorphic high electron mobility transistors (PHEMTs) are extensively used in wireless communication systems for switching, power and low noise amplifier applications. These transistors find wide market acceptance because of their high RF gain and power added efficiency (PAE) and low noise figure (NF). The excellent properties of these transistors also make them attractive for use in satellite communication systems including direct broadcast satellite television (DBS-TV) and global satellite communication systems. PHEMT technology is also used in high-speed analog and digital IC's such as 2.5-10 Gb/s lightwave communication systems. The higher frequency response of PHEMTs are currently finding use in millimeter wave communications (40 Gb/s) and radar systems.

The increasing market demand for RF power devices with higher and higher performance for wireless communication systems, radar detection, satellite and electronic warfare systems has led the electronics industry to extend the operating frequencies of available power devices and technologies. To increase operating frequencies of power devices up to the millimeter wave range, several key technological features have been proposed including an optimized PHEMT epitaxial layer structure, an optimized device layout of the unit cell for specific applications, and thin-film technology development adequate for high frequency functions. In particular, the most significant requirement set for the epitaxial layer structure is associated with the condition of ensuring that free electrons in the conductive channel are physically separated from ionized donors. This solution allows for a significant reduction in ionized impurity scattering, enhancing electron mobility and therefore marked performance improvements over conventional metal-semiconductor field effect transistors (MESFET).

Additionally, pseudomorphic high electron mobility transistors PHEMTs usually require a negative gate voltage bias to operate (see for example U.S. 2002/024057 A1). Therefore, as compared to heterojunction bipolar transistors (HBTs) that use a positive gate voltage, the introduction of such a negative voltage disadvantageously requires a dedicated voltage supply circuit that increases chip complexity and manufacturing costs.

A PHEMT power device capable of operating with a single voltage supply is for example disclosed in U.S. Pat. No. 6,593,603. The PHEMT power device includes an epitaxial substrate including a GaAs buffer layer, an AlGaAs/GaAs superlattice layer, an undoped AlGaAs layer, a first doped silicon layer, a first spacer, an InGaAs electron transit layer, a second spacer, a second doped silicon layer having a different doping concentration from the first doped silicon layer, a lightly doped AlGaAs layer, and an undoped GaAs cap layer stacked sequentially on a semi-insulating GaAs substrate; a source electrode and a drain electrode formed on and in ohmic contact with the undoped GaAs cap layer; and a gate electrode formed on the lightly doped AlGaAs layer to extend through the undoped GaAs cap layer.

OBJECT AND SUMMARY OF THE INVENTION

The Applicant has noticed that in order to provide a PHEMT power device operable with a single voltage supply (the drain supply voltage only), it is necessary to optimize the pinch-off voltage that permits to achieve class A operating conditions (drain-to-source current equal to half of the maximum achievable one) while maintaining the gate grounded without any bias.

In particular, the Applicant has noticed that an optimized PHEMT power device having excellent linearity and power-added efficiency, high breakdown voltage, and capable of operating with a single voltage supply should meet the following requirements: a low knee voltage, a high and uniform transconductance, and a low source-gate capacitance.

In this respect, the Applicant has noticed that even if the PHEMT power device disclosed in U.S. Pat. No. 6,593,603 is operable with a single voltage supply, its performance proves however to be satisfactory only in the C frequency band (4 to 6 GHz), while becomes quite unsatisfactory in the X frequency band (8.0 to 12.0 GHz), and the PHEMT power device is completely unusable in the Ka (K-above) frequency band (18 to 40 GHz).

Therefore, the Applicant has noticed that in order to provide a PHEMT power device operable with a single voltage supply and having also excellent performance in the X frequency band and the Ka frequency band, it is necessary to further optimize the structure of the dedicated epitaxial substrate and, consequently, the device manufacturing process disclosed in U.S. Pat. No. 6,593,603.

The main objective of present invention is therefore to provide a PHEMT power device operable with a single voltage supply, suitable for a satisfactory use in high-frequency digital wireless communications, in particular which may be used to amplify signals up to 40 GHz, i.e., for example C frequency band, X frequency band and Ka frequency band, and having a higher linearity, breakdown voltage and power-added efficiency than the PHEMTs in the prior art.

Another objective of present invention is to provide a process for manufacturing this PHEMT power device.

These objectives are achieved by the present invention in that it relates to a PHEMT power device and to a process for manufacturing the same, as defined in the appended claims.

The present invention achieves the aforementioned objective by exploiting advances in epitaxial growth technologies of III-V semiconductor heterojunctions, which advances ensure the possibility of engineering the band structure, doping type and level in different regions of semiconductor devices, and by adopting new semiconductor materials with superior electrical characteristics, such as wide band-gap semiconductor, and by properly designing the PHEMT structure. Use of these additional degrees of freedom provides the opportunity of developing new devices with considerable improvement in RF performance. In particular, the present invention achieves the aforementioned objective by introducing an optimized epilayer sequence and a double recessed gate geometry. More in detail, the present invention achieves the aforementioned objective by providing a pseudomorphic high electron mobility transistor (PHEMT) power device including:

a semi-insulating substrate;

an epitaxial substrate formed on the semi-insulating substrate; the epitaxial substrate including a buffer layer, a superlattice layer, a first electron supply layer, a first spacer layer, an electron transit layer, a second spacer layer, a second electron supply layer, a Schottky layer, and a contact layer sequentially stacked on the semi-insulating substrate;

source and drain electrodes formed on, and in ohmic contact with the contact layer; and a gate electrode formed on the Schottky layer to extend through the contact layer;

the PHEMT power device being characterized in that the contact layer includes:

a lightly doped contact layer formed on the Schottky layer;

a highly doped contact layer formed on the lightly doped contact layer and having a doping concentration higher than the lightly doped contact layer;

the PHEMT power device being further characterized by:

a wide recess formed to penetrate the highly doped contact layer so as to expose a surface of the lightly doped contact layer; and a narrow recess formed in the wide recess to penetrate the lightly doped contact layer so as to expose a surface of the Schottky layer;

wherein the gate electrode is formed in the narrow recess and in Schottky contact with the Schottky layer to extend from the exposed surface of the Schottky layer through the lightly and highly doped contact layers; and the source and drain electrodes are formed on, and in ohmic contact with the highly doped contact layer outside the wide recess so that the wide recess is arranged between the source and drain electrodes.

BRIEF DESCRIPTION OF THE DRAWINGS

For a better understanding of the present invention, preferred embodiments, which are intended purely by way of example and are not to be construed as limiting, will now be described with reference to the attached drawings, wherein.

DETAILED DESCRIPTION OF PREFERRED EMBODIMENTS OF THE INVENTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein and defined in the attached claims.

Figure 1:
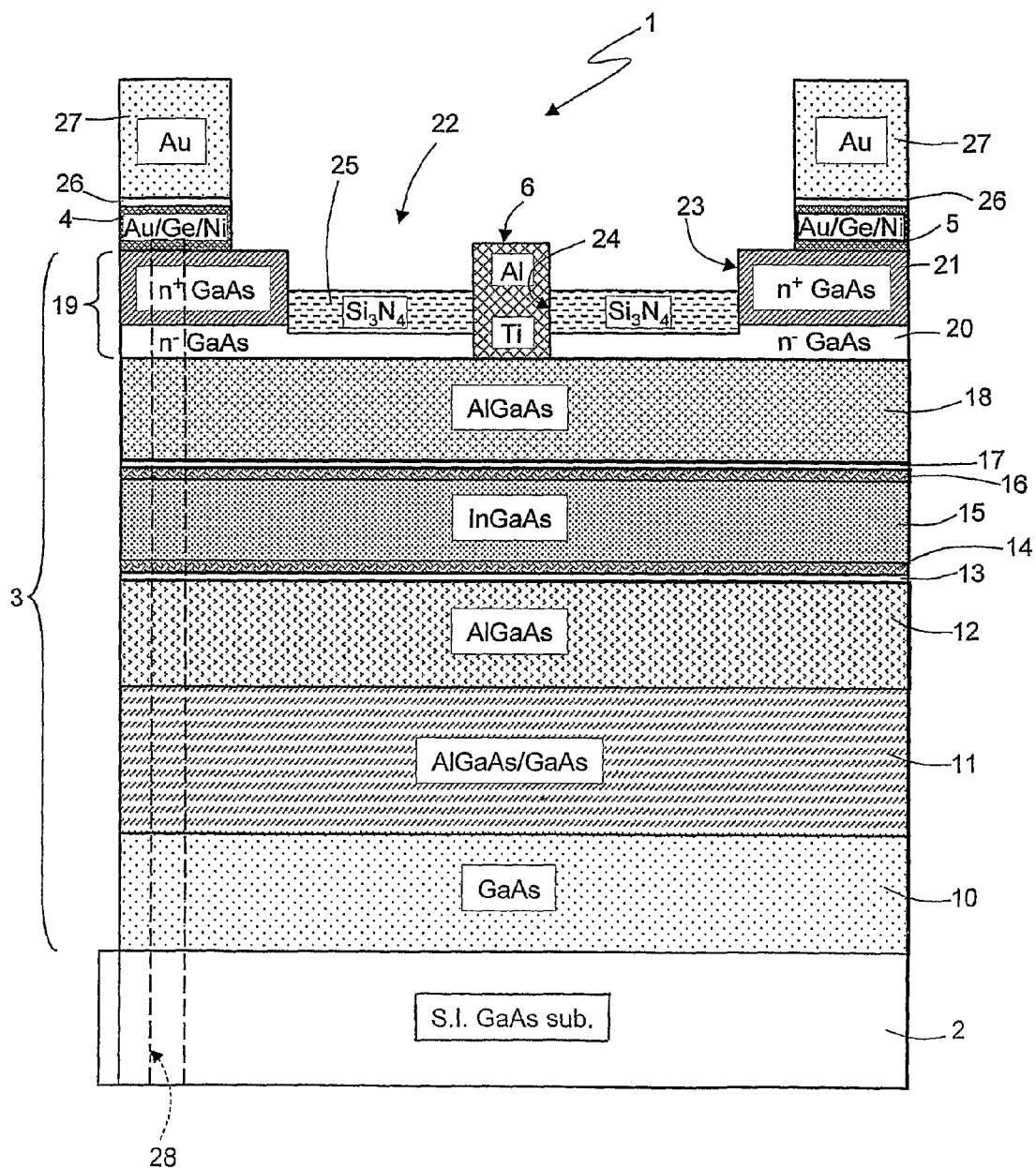
FIG. 1 is a sectional view of a PHEMT power device according to an embodiment of the present invention.

FIG. 1 is a sectional view of a PHEMT power device according to an embodiment of the present invention.

The PHEMT power device 1 includes a III-V substrate 2, e.g. a semi-insulating GaAs substrate, a doped epitaxial substrate 3 formed on the semi-insulating GaAs substrate 2, and source, drain and gate electrodes 4, 5 and 6 formed on the epitaxial substrate 3.

In particular, epitaxial substrate 3 comprises an undoped GaAs buffer layer 10; an undoped AlGaAs/GaAs superlattice layer 11; an undoped wide-bandgap AlGaAs layer 12; a first ultra thin doped silicon (pulse) electron supply (donor) layer 13, a first spacer layer 14, an undoped narrow-bandgap InGaAs electron transit (channel) layer 15, a second spacer layer 16, a second ultra thin silicon doped (pulse) electron supply (donor) layer 17 with a different doping concentration than the first electron supply layer 13, an undoped or lightly doped wide-bandgap Schottky AlGaAs layer 18, and a GaAs (ohmic) contact (cap) layer 19 sequentially stacked on the semi-insulating GaAs substrate 2.

In order to lower ohmic contact resistance between GaAs contact layer 19 and source and drain electrodes 4, 5, GaAs contact layer 19 is doped and includes a lower lightly doped GaAs contact layer 20 and an upper highly doped GaAs contact layer 21. In particular, doped GaAs contact layer 19 is approximately 100 nm thick, lightly doped GaAs contact layer 20 is approximately 30 nm thick and is formed to have a doping concentration of approximately $3 \cdot 10^{17}$ cm$^{-3}$, and highly doped GaAs contact layer 21 is approximately 70 nm thick and is formed to have a doping concentration of approximately $3.5 \cdot 10^{18}$ cm$^{-3}$.

Undoped AlGaAs layer 12 is approximately 4 nm thick and contains aluminum (Al) approximately ranging from 22% to 24% by mole ratio, InGaAs electron transit layer 15 is approximately 13-15 nm thick and contains indium (In) ranging approximately from 15% to 20% by mole ratio; and lightly doped AlGaAs layer 18 is approximately 30 nm thick, contains aluminum (Al) approximately ranging from 22% to 24% by mole ratio, and is formed to have a doping concentration ranging approximately from $1.0 \cdot 10^{17}$ to $3.0 \cdot 10^{17}$ cm$^{-3}$.

In order to improve transconductance linearity, the first electron supply layer 13 has a lower doping concentration than the second electron supply layer 17. Additionally, in order to have a doping level in the InGaAs electron transit layer 15 approximately ranging from $1.7 \cdot 10^{12}$ to $2.7 \cdot 10^{12}$ cm$^{-2}$, first electron supply layer 13 is formed to have a doping level of approximately $1 \cdot 10^{12}$ cm$^{-2}$, and second electron supply layer 17 is formed to have a doping level of approximately $5 \cdot 10^{12}$ cm$^{-2}$. Additionally, the first and the second electron supply layers 13, 17 are each approximately 0.5 nm thick.

To obtain Ohmic contact an Au/Ge/Ni/Au metallization is deposited on the highly doped GaAs contact layer 21 and subjected to rapid thermal annealing (RTA) to form source and drain electrodes 4, 5 in ohmic contact with the highly doped GaAs contact layer 21.

In order to separate active areas of individual PHEMT power devices, epitaxial substrate 3 may be mesa-etched or, preferably, ion implanted using Deuterium or Fluorine high energy ions down to the AlGaAs/GaAs superlattice layer 11.

After these two steps in order to increase the breakdown voltage and maintain the knee voltage low, while preserving high transconductance and high PHEMT gain, thereby improving the PHEMT power characteristics, doped GaAs contact layer 19 is recess etched to form a double recess structure 22 including an upper wide recess 23 formed in the highly doped GaAs contact layer 21 and a lower narrow recess 24 formed in lightly doped GaAs contact layer 20 and partly in lightly doped AlGaAs layer 18. In particular, to form double recess structure 22, highly doped GaAs contact layer 21 between source and drain electrodes 4, 5 is etched to form wide recess 23, and then lightly doped GaAs contact layer 20 is selectively wet etched inside the wide recess 23 down to lightly doped AlGaAs layer 18 to form narrow recess 24. In particular, selective etching is carried out using a ph-controlled and temperature-controlled citric acid and hydrogen peroxide solution. Additionally, each one of the two etchings are performed by patterning lightly and highly doped GaAs contact layers 20, 21 with positive i-line photoresists. Presence of the lightly doped AlGaAs layer 18 ensures etching uniformity even in wet etching performed to form the double recess during the manufacture of the PHEMT power device 1.

After formation of double recess 22, gate electrode 6 is then formed in contact with the AlGaAs Schottky layer 18 by evaporating titanium (Ti) and aluminium (Al) on an exposed surface of the AlGaAs Schottky layer 18. In particular, gate electrode 6 extends centrally in double recess 22 from AlGaAs Schottky layer 18 and through both lightly and highly doped lower GaAs contact layers 20, 21 and protrudes outside double recess 22.

A protective insulating layer 25, for example made of silicon nitride ($Si_3N_4$), is then formed, for example by Plasma Enhanced Chemical Vapour Deposition (PECVD), on a surface of the highly doped GaAs contact layer 21 exposed by source, drain and gate electrodes 4, 5, 6.

A Ti/Pt/Au base metal layer 26 is then formed, for example by evaporation, and then layered on source and drain electrodes 4, 5, and an Au layer 27 is then formed, for example by electroplating, on the base metal layer 26. Base metal layer 26 defines an interdiffusion barrier that isolates ohmic contact and prevents gold from diffusing from Au-plated layer 27 to source and gate electrodes 4, 5.

Source and drain electrodes 4, 5 are then connected to respective source and drain pads (not shown) via Au-plated airbridges (not shown).

Finally, semi-insulating GaAs substrate 2 is thinned down from an initial thickness of approximately 650 μm to a final thickness ranging approximately from 50 to 120 μm, and then the PHEMT 1 is back-etched to form a via-hole 28, which is metallized, including a surrounding area, with a thick Au layer to extend from thinned semi-insulating GaAs substrate 2 up to source electrode 4 for source pad interconnection, in order to minimize the parasitic source-to-ground inductances, and heat sink provision.

Figure 2:
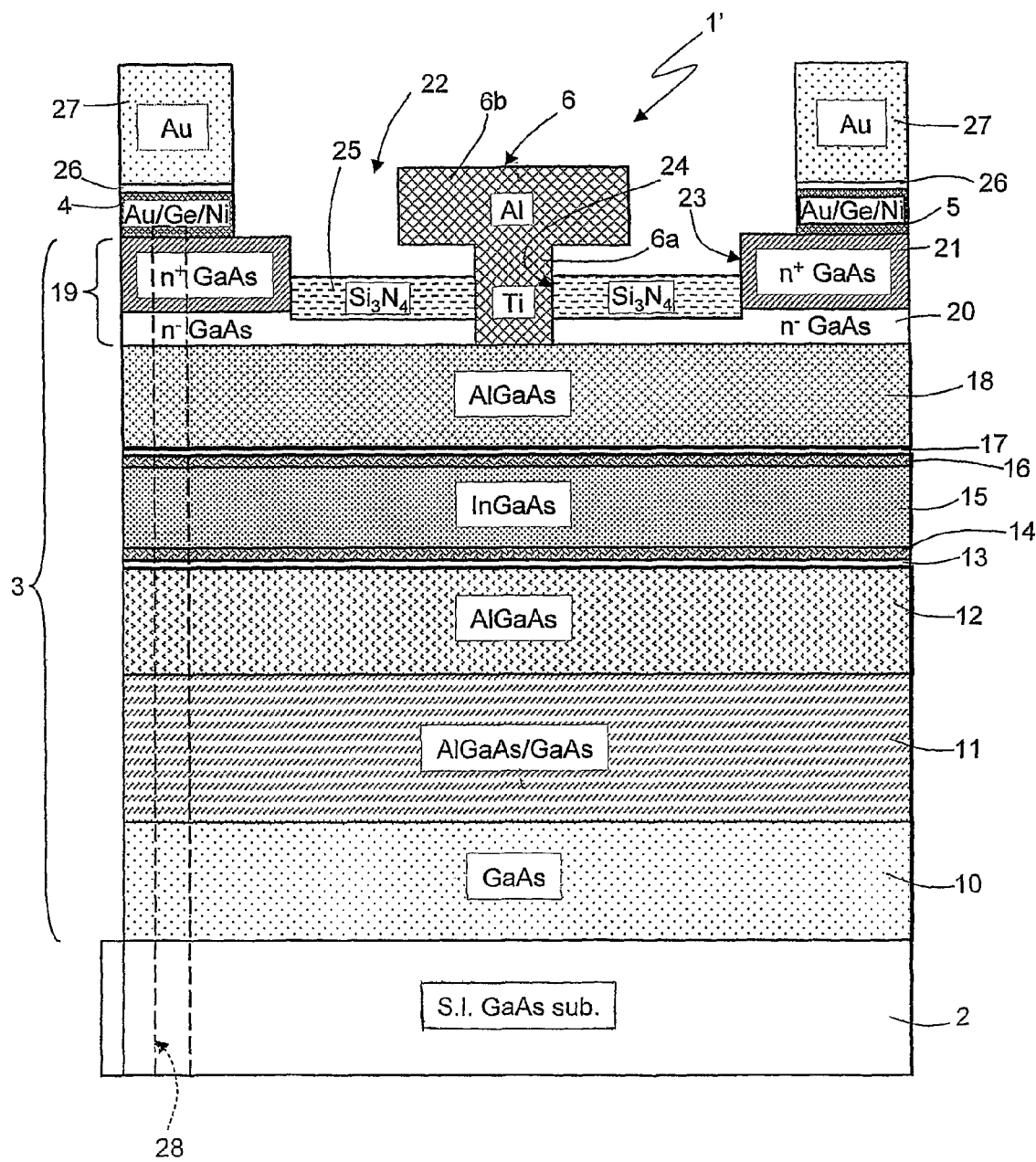
FIG. 2 is a sectional view of a PHEMT power device according to another embodiment of the present invention.

FIG. 2 is a sectional view of a PHEMT power device similar to that shown in FIG. 1, where same reference numerals designate same elements. In particular, PHEMT power device shown in FIG. 2, designated by 1', differs from PHEMT power device 1 shown in FIG. 1 in that gate electrode 6 is generally T-shaped with a lower leg portion 6a formed of Ti and an upper head portion 6b formed of Al. More in detail, leg portion 6a of gate electrode 6 has an height substantially equal to depth of double recess 22, so that head portion 6b of gate electrode 6 protrudes outside double recess 22. More in detail, the T shape is obtained by dry-etching the Ti of the gate metal stack in a suitable Fluorine/Oxygen plasma chemistry in low-damage isotropic plasma-etch reactor. The Fluorine gas carrier could be $CF_4$, or $CHF_3$ or $SF_6$. The oxygen carrier gas could be $O_2$.

The Plasma is created by an RF discharge in a Plasma Etch parallel plate configuration. Each plate of the chamber is heated, for example in the range 100 to 200° C., the chamber pressure is in the range 200 to 1000 mTorr. RF power discharge should be lowered to reduce as much as possible surface damage caused by ion and electron bombardment. When a Plasma Etch parallel plate configuration is utilised for this gate etch the RF power discharge must be lower than 50 Watt. Furthermore, better results are achievable if equipments able to ensure cold plasma are introduced (ECR—Electron Cyclotron Resonance, ICP—Inductively Coupled Plasma).

In such a process, the Al of the head portion 6b of the gate electrode 6 is used as a mask layer because the Al becomes fluorinated and remains un-etched by the Fluorine plasma. So, the head portion 6b of the gate electrode 6, made of Al, stays un-etched, while the leg portion 6a of the of the gate electrode 6, made of Ti and lying on the AlGaAs Schottky layer 18, becomes laterally etched. In this way a gate length down to 0.15 μm can be obtained with a quick and low-cost manufacturing process, keeping a low gate finger resistance.

Figure 3:
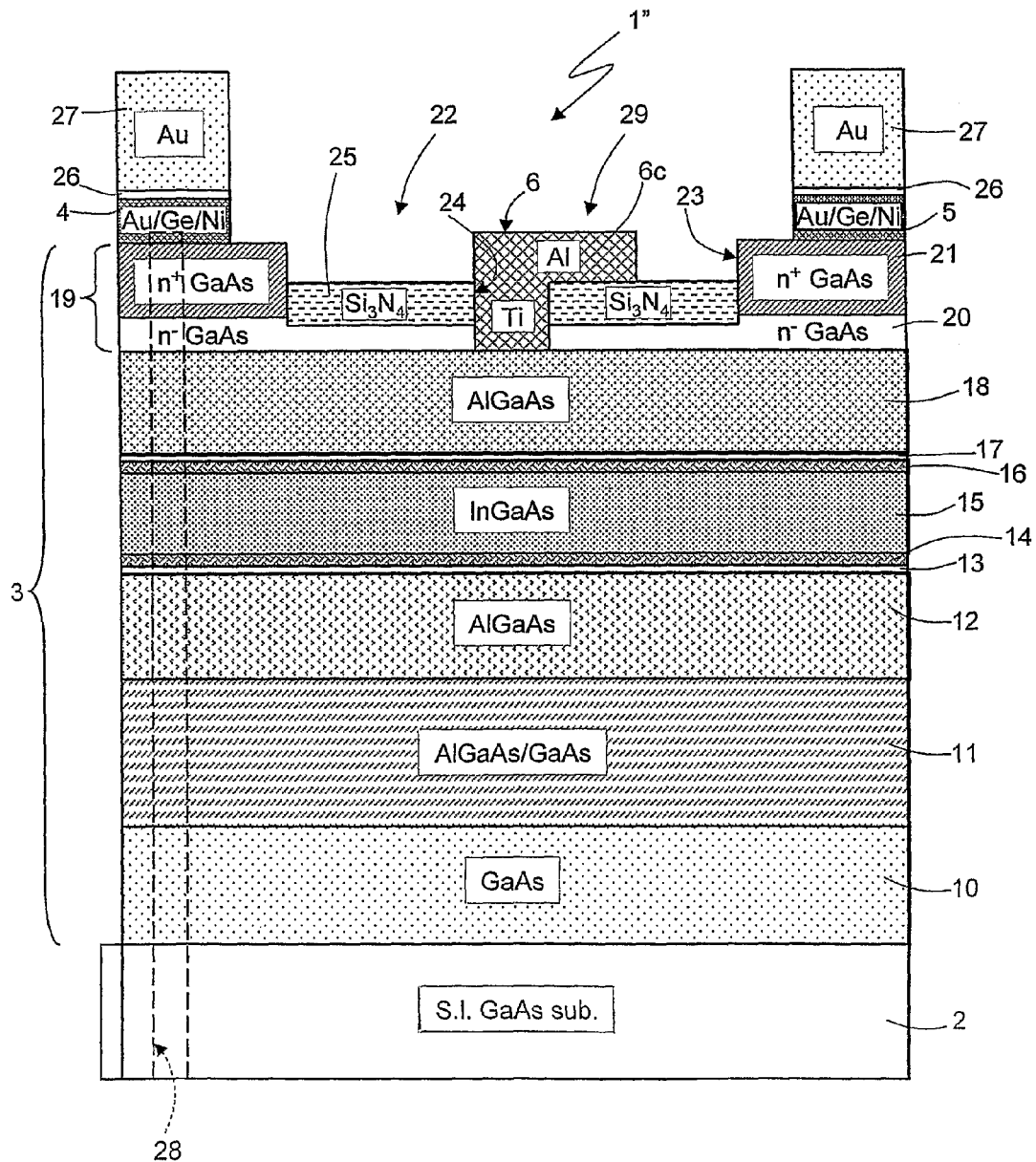
FIG. 3 is a sectional view of the PHEMT power device according to a different embodiment of the present invention.

FIG. 3 is a sectional view of a PHEMT power device similar to those shown in FIGS. 1 and 2, where same reference numerals designate same elements. In particular, PHEMT power device shown in FIG. 3, designated by 1", differs from PHEMT power devices shown in FIGS. 1 and 2 in that it is provided with a field plate 29 connected to the gate electrode 6 and extending toward the drain electrode 5 without overlapping either the highly doped contact layer 21 or the drain electrode (5). In particular, the field plate 29 is formed as a gate extension 6c coplanar with highly doped GaAs contact layer 21, vertically overlapping part of protective insulating layer 25 on the lightly doped GaAs contact layer 20, and ending at a distance of 1.0 μm from highly doped lower GaAs contact layer 21. The protective insulating layer 25 made of silicon nitride ($Si_3N_4$) is ultra-thin (less than 50 nm), and is deposited by PECVD so optimized to reach a high dielectric constant of the $Si_3N_4$, and to control the GaAs/$Si_3N_4$ interface states.

In the PHEMT power devices shown in FIGS. 1, 2, and 3 different GaAs and AlGaAs layers are provided, but the heterojunction of greatest interest is that between silicon doped AlGaAs layer 12 and 18 and undoped InGaAs layer 15. In fact, due to the higher bandgap of AlGaAs layer compared to the adjacent InGaAs layer, free electrons diffuse into the InGaAs layer and form a two dimensional electron gas (2-DEG) at the heterointerface, where they remain confined in a very thin sheet, and transport properties of the 2-DEG are much better than those of free electrons in a conventional MESFET.

AlGaAs layer 18 is the donor layer, and in the final PHEMT power device this layer should be depleted from Schottky gate 6 to AlGaAs/GaAs interface to eliminate any effect of parallel conduction in AlGaAs otherwise detrimental to PHEMT performance. During heterostructure design, it must be considered that increasing the doping level in the donor layer reduces the breakdown voltage of the PHEMT. To overcome this difficulty while maintaining a high 2-DEG sheet carrier concentration, it is possible to use a pulsed doped, δ doped AlGaAs layer. This solution makes use of a Si monolayer, approximately 0.5 nm thick, with a very high doping level.

As for thickness of spacer layers 14, 16, even thought free electrons are physically separated from donors, close proximity produces an electrostatic interaction, known as Coulomb Scattering. This effect is reduced by separating the 2-DEG from the AlGaAs donor layer by means of a thin spacer layer of undoped AlGaAs. It is worthwhile to mention that noise performance of a PHEMT is strictly connected to spacer thickness.

As for GaAs buffer layer 10, because of drain to source electric field, part of electrons can be injected into GaAs buffer layer 10. This phenomenon induces a gain reduction as a result of increasing drain output conductance. In the PHEMTs, electron injection into the GaAs buffer layer 10 is controlled by means of AlGaAs/GaAs superlattice layer 11 into GaAs buffer layer 10, that at the same time does not change channel quality.

Described herebelow are results of characteristic measurements carried out on a PHEMT power device manufactured according to the present invention and with a 0.5-μm-gate length, 0.25-μm-gate length and with a field-plate structure. All the mentioned results are referred to a 100-μm-unit gate width and for 1-mm-total gate width. In particular, as far as transconductance and saturation current are concerned, the PHEMT power device with different gate length according to the present invention has a pinch-off voltage approximately from −0.8V to −0.6V, a saturation current ranging from 100 to 300 mA/mm at a gate voltage of 0V, and a maximum saturation current ranging from 300 to 600 mA/mm at a gate voltage of 0.8V. In addition, transconductance is nearly consistent in the range of 250-350 mS/mm at a gate voltage ranging from 0 to 1V. As a result, the PHEMT power device exhibits improved linearity. As far as current-voltage characteristic is concerned, the PHEMT power device according to the present invention exhibits a low knee voltage of about 1V and a off-state breakdown voltage of about 18V without a field-plate structure and of 40V with a field-plate structure, while maximum current remained unaffected. This result explains that a high gate drain breakdown voltage can be obtained keeping low ohmic contact resistance. As far as power characteristics are concerned, the PHEMT power device according to the present invention has an output power up to 29 dBm/mm with an associated power gain up to 12 dB, which power characteristics have been determined by a load-pull method at a typical value of 1 dB of gain compression up to a frequency of 10 GHz if the gate length is conveniently adapted. Introducing the field-plate structure, power performance are additionally increased achieving an output power up to 32 dBm/mm and an associated power gain up to 15 dB for C band applications. Finally, as far as high RF amplifier applications are concerned, the PHEMT power device according to the present invention may be used to amplify signals up to 40 GHz by appropriately varying the gate length.

The advantages of the present invention are evident from the foregoing. In particular, in the PHEMT power device according to the present invention, the formation of a doped GaAs contact layer 19, particularly made up of a lower lightly doped lower GaAs contact layer 20 and an upper highly doped lower GaAs contact layer 21 in ohmic contact with the source and drain electrodes allows the contact resistance therebetween to be lowered, thus improving voltage characteristics of the PHEMT.

Additionally, the formation of a double recess structure 22 made up of an upper wide recess 23 formed in upper highly doped GaAs contact layer 21 and of a lower narrow recess 24 formed in lower lightly doped GaAs contact layer 20 allows for the ohmic contact to be placed on highly doped GaAs contact layer 21, thus improving the overall power characteristics of the PHEMT, in particular significantly increasing the breakdown voltage while maintaining a low knee voltage, and improving linearity and power-added efficiency.

Moreover, the combination of the double recess structure 22 with the lightly and highly doped GaAs contact layers 20, 21 allows the PHEMT power device to operate with a single voltage supply, without any need for a negative bias voltage to the gate contact.

Further, the PHEMT of the present invention allows the Class A amplifier requirements to be fulfilled with the gate contact pad directly connected to ground.

Yet further, the doped silicon layer 13 with a lower doping concentration than the doped silicon layer 17 makes the transconductance of the PHEMT power device invariant with respect to gate-to-source voltages, while the lightly doped AlGaAs layer 18 ensures etching uniformity in wet recess etching performed to manufacture the PHEMT power device, thus making the overall manufacturing process for the PHEMT power device easy and hence improving the productivity.

Finally, a T-gate structure allows gate-to-source capacitance and gate finger resistance to be significantly reduced, allowing the PHEMT to achieve operating frequencies up to 40 GHz.

Finally, numerous modifications and variants can be made to the present invention, all falling within the scope of the invention, as defined in the appended claims.

For example, the undoped wide-bandgap AlGaAs layer and the first ultra thin doped silicon electron supply layer 13 may be replaced with a single uniformly doped AlGaAs electron supply layer.

The invention claimed is:

1. A single voltage supply pseudomorphic high electron mobility transistor (PHEMT) power device (1; 1'; 1") including:
   a semi-insulating substrate (2);
   an epitaxial substrate (3) formed on the semi-insulating substrate (2); the epitaxial substrate (3) including a buffer layer (10), a superlattice layer (11), a first electron supply layer (12, 13), a first spacer layer (14), an electron transit layer (15), a second spacer layer (16), a second electron supply layer (17), a Schottky layer (18), and a contact layer (19) sequentially stacked on the semi-insulating substrate (2);
   source and drain electrodes (4, 5) formed on, and in ohmic contact with the contact layer (19); and
   a gate electrode (6) formed on the Schottky layer (18) to extend through the contact layer (19);
   wherein the gate and source electrodes (4, 6) are intended to be grounded, and the drain electrode (5) is intended to be connected to a voltage supply;
   the PHEMT power device (1) being characterized in that the contact layer (19) includes:
   a lightly doped contact layer (20) formed on the Schottky layer (18);
   a highly doped contact layer (21) formed on the lightly doped contact layer (20) and having a doping concentration higher than the lightly doped contact layer (20);
   the PHEMT power device (1) being further characterized by:
   a wide recess (23) formed to penetrate the highly doped contact layer (21) so as to expose a surface of the lightly doped contact layer (20); and
   a narrow recess (24) formed in the wide recess (23) to penetrate the lightly doped contact layer (20) so as to expose a surface of the Schottky layer (18);
   wherein the gate electrode (6) is formed in the narrow recess (24) and in Schottky contact with the Schottky layer (18) to extend from the exposed surface of the Schottky layer (18) through the lightly and highly doped contact layers (20, 21); and
   the source and drain electrodes (4, 5) are formed on, and in ohmic contact with the highly doped contact layer (21) outside the wide recess (23) so that the wide recess (23) is arranged between the source and drain electrodes (4, 5).

2. The PHEMT power device of claim 1, further including:
   a protective insulating layer (25) formed on a surface of the highly doped contact layer (21) exposed by source, drain and gate electrodes (4, 5, 6).

3. The PHEMT power device of claim 2, further including:
   a field plate (29) formed on the protective insulating layer (25), electrically connected to the gate electrode (6) and extending toward the drain electrode (5) without overlapping either the highly doped contact layer (21) or the drain electrode (5).

4. The PHEMT power device of claim 3, wherein the field plate is formed as a gate extension (6c) which is substantially coplanar with the highly doped GaAs contact layer (21), vertically overlaps part of the lightly doped GaAs contact layer (20), and ends at a distance from the highly doped contact layer (21).

5. The PHEMT power device of claim 1, further including:
a base metal layer (26) formed on the source and drain electrodes (4, 5); and
an Au layer (27) formed on the base metal layer (26).

6. The PHEMT power device of claim 1, further including:
a metallized via-hole (28) formed to extend from the semi-insulating substrate (2) to the source electrode (4) for source pad interconnection and heat sink provision.

7. The PHEMT power device of claim 1, wherein the gate electrode (6) is generally T-shaped.

8. The PHEMT power device of claim 1, wherein the lightly doped contact layer (20) has a doping concentration of approximately $3 \cdot 10^{17}$ cm$^{-3}$, and the highly doped contact layer (21) has a doping concentration of approximately $3.5 \cdot 10^{18}$ cm$^{-3}$.

9. The PHEMT power device of claim 1, wherein the first and second electron supply layers (13, 17) are formed to have doping concentrations so as to have a doping level in the electron transit layer (15) approximately ranging from $1.7 \cdot 10^{12}$ to $2.7 \cdot 10^{12}$ cm$^{-2}$.

10. The PHEMT power device of claim 1, wherein the second electron supply layer (17) is formed to have a doping concentration higher than the first electron supply layer (13).

11. The PHEMT power device of claim 10, wherein the first electron supply layer (13) is formed to have a doping level of approximately $1 \cdot 10^{12}$ cm$^{-2}$, and the second electron supply layer (17) is formed to have a doping level of approximately $5 \cdot 1012$ cm$^{-2}$.

12. The PHEMT power device of claim 1, wherein the electron transit layer (15) contains indium ranging approximately from 15% to 20% by mole ratio, the Schottky layer (18) contains aluminum approximately ranging from 22% to 24% by mole ratio, and is formed to have a doping concentration ranging approximately from $1.0 \cdot 10^{17}$ to $3.0 \cdot 10^{17}$ cm$^{-3}$.

13. , A single voltage supply pseudomorphic high electron mobility transistor (PHEMT) power device (1; 1'; 1") including:
a semi-insulating substrate (2);
an epitaxial substrate (3) formed on the semi-insulating substrate (2); the epitaxial substrate (3) including a buffer layer (10), a superlattice layer (11), a first electron supply layer (12, 13), a first spacer layer (14), an electron transit layer (15), a second spacer layer (16), a second electron supply layer (17), a Schottky layer (18), and a contact layer (19) sequentially stacked on the semi-insulating substrate (2);
source and drain electrodes (4, 5) formed on, and in ohmic contact with the contact layer (19); and
a gate electrode (6) formed on the Schottky layer (18) to extend through the contact layer (19);
wherein the gate and source electrodes (4, 6) are intended to be grounded, and the drain electrode (5) is intended to be connected to a voltage supply;
the PHEMT power device (1) being characterized in that the contact layer (19) includes:
a lightly doped contact layer (20) formed on the Schottky layer (18);
a highly doped contact layer (21) formed on the lightly doped contact layer (20) and having a doping concentration higher than the lightly doped contact layer (20);
the PHEMT power device (1) being further characterized by:
a wide recess (23) formed to penetrate the highly doped contact layer (21) so as to expose a surface of the lightly doped contact layer (20); and
a narrow recess (24) formed in the wide recess (23) to penetrate the lightly doped contact layer (20) so as to expose a surface of the Schottky layer (18);
wherein the gate electrode (6) is formed in the narrow recess (24) and in Schottky contact with the Schottky layer (18) to extend from the exposed surface of the Schottky layer (18) through the lightly and highly doped contact layers (20, 21);
the source and drain electrodes (4, 5) are formed on, and in ohmic contact with the highly doped contact layer (21) outside the wide recess (23) so that the wide recess (23) is arranged between the source and drain electrodes (4, 5); and
wherein the substrate (2) is a semi-insulating substrate formed of GaAs, the buffer layer (10) is formed of GaAs, the superlattice layer (11) is formed of AlGaAs/GaAs, the first and second electron supply layers (13, 17) are formed of doped silicon, the electron transit layer (15) is formed of InGaAs; the Schottky layer (18) is formed of AlGaAs, the lightly and highly doped contact layers (21, 22) are formed of GaAs, the gate electrode (6) is formed of Ti/Al, the source and drain electrodes (4, 5) are formed of Au/Ge/Ni/Au metal thin films, a protective insulating layer (25) is formed of silicon nitride, and the base metal layer (26) is formed of Ti/Pt/Au.

14. A single voltage supply pseudomorphic high electron mobility transistor (PHEMT) power device (1; 1'; 1") including:
a semi-insulating substrate (2);
an epitaxial substrate (3) formed on the semi-insulating substrate (2): the epitaxial substrate (3) including a buffer layer (10), a superlattice layer (11), a first electron supply layer (12, 13), a first spacer layer (14), an electron transit layer (15), a second spacer layer (16), a second electron supply layer (17), a Schottky layer (18), and a contact layer (19) sequentially stacked on the semi-insulating substrate (2);
source and drain electrodes (4, 5) formed on, and in ohmic contact with the contact layer (19); and
a gate electrode (6) formed on the Schottky layer (18) to extend through the contact layer (19);
wherein the gate and source electrodes (4, 6) are intended to be grounded, and the drain electrode (5) is intended to be connected to a voltage supply;
the PHEMT power device (1) being characterized in that the contact layer (19) includes:
a lightly doped contact layer (20) formed on the Schottky layer (18);
a highly doped contact layer (21) formed on the lightly doped contact layer (20) and having a doping concentration higher than the lightly doped contact layer (20);
the PHEMT power device (1) being further characterized by:
a wide recess (23) formed to penetrate the highly doped contact layer (21) so as to expose a surface of the lightly doped contact layer (20); and
a narrow recess (24) formed in the wide recess (23) to penetrate the lightly doped contact layer (20) so as to expose a surface of the Schottky layer (18);

wherein the gate electrode (6) is formed in the narrow recess (24) and in Schottky contact with the Schottky layer (18) to extend from the exposed surface of the Schottky layer (18) through the lightly and highly doped contact layers (20, 21);

the source and drain electrodes (4, 5) are formed on, and in ohmic contact with the highly doped contact layer (21) outside the wide recess (23) so that the wide recess (23) is arranged between the source and drain electrodes (4, 5); and wherein the first electron supply layer (12, 13) includes: an undoped wide-bandgap layer (12) formed on the superlattice layer (11); and a doped silicon layer (13) formed on the undoped wide-bandgap layer (12).

15. The PHEMT power device of claim 14, wherein the undoped wide-bandgap layer (12) is formed of AlGaAs and contains aluminum approximately ranging from 22% to 24% by mole ratio.

16. A process for manufacturing a single voltage supply pseudomorphic high electron mobility transistor (PHEMT) power device (1; 1'; 1"), comprising:

providing a semi-insulating substrate (2);

forming an epitaxial substrate (3) on the semi-insulating substrate (2), wherein forming an epitaxial substrate (3) includes sequentially stacking a buffer layer (10), a superlattice layer (11), a first electron supply layer (12, 13), a first spacer layer (14), an electron transit layer (15), a second spacer layer (16), a second electron supply layer (17), a Schottky layer (18), and a contact layer (19) on the semi-insulating substrate (2);

forming source and drain electrodes (4, 5) on, and in ohmic contact with the contact layer (19); and forming a gate electrode (6) on the Schottky layer (18) to extend through the contact layer (19);

wherein the gate and source electrodes (4, 6) are intended to be grounded, and the drain electrode (5) is intended to be connected to a voltage supply;

the manufacturing process being characterized in that forming a contact layer (19) includes:

forming a lightly doped contact layer (20) on the Schottky layer (18);

forming a highly doped contact layer (21) on the lightly doped contact layer (20) and having a doping concentration higher than the lightly doped contact layer (20);

the process being further characterized by:

forming a wide recess (23) to penetrate the highly doped contact layer (21) so as to expose a surface of the lightly doped contact layer (20); and forming a narrow recess (24) in the wide recess (23) to penetrate the lightly doped contact layer (20) so as to expose a surface of the Schottky layer (18);

wherein the gate electrode (6) is formed in the narrow recess (24) and in Schottky contact with the Schottky layer (18) to extend from the exposed surface of the Schottky layer (18) through the lightly and highly doped contact layers (20, 21); and the source and drain electrodes (4, 5) are formed on, and in ohmic contact with the highly doped contact layer (21) outside the wide recess (23) so that the wide recess (23) is arranged between the source and drain electrodes (4, 5).

17. The process of claim 16, wherein source and drain electrodes (4, 5) are formed before the wide and narrow recesses (20, 21).

18. The process of claim 16, wherein forming source and drain electrodes (4, 5) includes:

forming respective metal thin films on the highly doped contact layer (21); and rapidly thermally annealing the deposited metal thin films.

19. The process of claim 16, further including:

forming a protective insulating layer (25) on a surface of the highly doped contact layer (21) exposed by the source, drain and gate electrodes (4, 5, 6).

20. The process of claim 19, further including:

forming a field plate (29) on the protective insulating layer (25), electrically connected to the gate electrode (6) and extending toward the drain electrode (5) without overlapping either the highly doped contact layer (21) or the drain electrode (5).

21. The process of claim 20, wherein forming a field plate includes:

forming a gate extension (6c) substantially coplanar with the highly doped GaAs contact layer (21), vertically overlapping part of the lightly doped GaAs contact layer (20), and ending at a distance from the highly doped contact layer (21).

22. The process of claim 16, further including:

forming a base metal layer (26) on the source and drain electrodes (4, 5); and forming an Au layer (27) on the base metal layer (26).

23. The process of claim 16, further including:

forming and metalizing a via-hole (28) to extend from the semi-insulating substrate (2) to the source electrode (4) for source pad interconnection and heat sink provision.

24. The process of claim 23, wherein forming a via-hole (28) includes:

back-etching the semi-insulating substrate (2) and the epitaxial substrate (3).

25. The process of claim 23, further including:

thinning the semi-insulating substrate (2) before formation of the via-hole (28).

26. The process of claim 16, wherein the gate electrode (6) is generally T-shaped.

27. The process of claim 24, wherein the T-shaped gate electrode (6) includes a narrow portion (6a) formed of Titanium in the narrow recess (24), and a wide portion (6b) formed of Aluminium outside the narrow recess (24);

and wherein forming the T-shaped gate electrode (6) includes:

evaporating the Titanium and the Aluminium on an exposed surface of the Schottky layer (18); and dry-etching the Titanium in a Fluorine/Oxygen plasma.

28. The process of claim 16, wherein the lightly doped contact layer (20) has a doping concentration of approximately $3 \cdot 10^{17}$ cm$^{-3}$, and the highly doped contact layer (21) has a doping concentration of approximately $3.5 \cdot 10^{18}$ cm$^{-3}$.

29. The process of claim 16, wherein the first and second electron supply layers (13, 17) are formed to have doping concentrations so as to have a doping level in the electron transit layer (15) approximately ranging from $1.7 \cdot 10^{12}$ to $2.7 \cdot 10^{12}$ cm$^{-2}$.

30. The process of claim 16, wherein the second electron supply layer (17) is formed to have a doping concentration higher than the first electron supply layer (13).

31. The process of claim 30, wherein the first electron supply layer (13) is formed to have a doping level of approximately $1 \cdot 10^{12}$ cm$^{-2}$, and the second electron supply layer (17) is formed to have a doping level of approximately $5 \cdot 10^{12}$ cm$^{-2}$.

32. The process of claim 16, wherein the electron transit layer (15) contains indium ranging approximately from 15% to 20% by mole ratio, the Schottky layer (18) contains aluminum approximately ranging from 22% to 24% by mole ratio, and is formed to have a doping concentration ranging approximately from $1.0 \cdot 10^{17}$ to $3.0 \cdot 10^{17}$ cm$^{-3}$.

33. A process for manufacturing a single voltage supply pseudomorphic high electron mobility transistor (PHEMT) power device (1 ; 1'; 1"), comprising:

providing a semi-insulating substrate (2);

forming an epitaxial substrate (3) on the semi-insulating substrate (2), wherein forming an epitaxial substrate (3) includes sequentially stacking a buffer layer (10), a superlattice layer (11), a first electron supply layer (12, 13), a first spacer layer (14), an electron transit layer (15), a second spacer layer (16), a second electron supply layer (17), a Schottky layer (18), and a contact layer (19) on the semi-insulating substrate (2);

forming source and drain electrodes (4, 5) on, and in ohmic contact with the contact layer (19): and forming a gate electrode (6) on the Schottky layer (18) to extend through the contact layer (19);

wherein the gate and source electrodes (4, 6) are intended to be grounded, and the drain electrode (5) is intended to be connected to a voltage supply;

the manufacturing process being characterized in that forming a contact layer (19) includes:

forming a lightly doped contact layer (20) on the Schottky layer (18);

forming a highly doped contact layer (21) on the lightly doped contact layer (20) and having a doping concentration higher than the lightly doped contact layer (20);

the process being further characterized by:

forming a wide recess (23) to penetrate the highly doped contact layer (21) so as to expose a surface of the lightly doped contact layer (20); and forming a narrow recess (24) in the wide recess (23) to penetrate the lightly doped contact layer (20) so as to expose a surface of the Schottky layer (18);

wherein the gate electrode (6) is formed in the narrow recess (24) and in Schottky contact with the Schottky layer (18) to extend from the exposed surface of the Schottky layer (18) through the lightly and highly doped contact layers (20, 21);

the source and drain electrodes (4, 5) are formed on, and in ohmic contact with the highly doped contact layer (21) outside the wide recess (23) so that the wide recess (23) is arranged between the source and drain electrodes (4, 5); and wherein the substrate (2) is a semi-insulating substrate formed of GaAs, the buffer layer (10) is formed of GaAs, the superlattice layer (11) is formed of AlGaAs/GaAs, the first and second electron supply layers (13, 17) are formed of doped silicon, the electron transit layer (15) is formed of InGaAs; the Schottky layer (18) is formed of AlGaAs, the lightly and highly doped contact layers (21, 22) are formed of GaAs, the gate electrode (6) is formed of Ti/Al, the source and drain electrodes (4, 5) are formed of Au/Ge/Ni/Au metal thin films, a protective insulating layer (25) is formed of silicon nitride, and the base metal layer (26) is formed of Ti/Pt/Au.

34. A process for manufacturing a single voltage supply pseudomorphic high electron mobility transistor (PHEMT) power device (1; 1'; 1"), comprising:

providing a semi-insulating substrate (2);

forming an epitaxial substrate (3) on the semi-insulating substrate (2), wherein forming an epitaxial substrate (3) includes sequentially stacking a buffer layer (10), a superlattice layer (11), a first electron supply layer (12, 13), a first spacer layer (14), an electron transit layer (15), a second spacer layer (16), a second electron supply layer (17), a Schottky layer (18), and a contact layer (19) on the semi-insulating substrate (2);

forming source and drain electrodes (4, 5) on, and in ohmic contact with the contact layer (19); and forming a gate electrode (6) on the Schottky layer (18) to extend through the contact layer (19);

wherein the gate and source electrodes (4, 6) are intended to be grounded, and the drain electrode (5) is intended to be connected to a voltage supply;

the manufacturing process being characterized in that forming a contact layer (19) includes:

forming a lightly doped contact layer (20) on the Schottky layer (18);

forming a highly doped contact layer (21) on the lightly doped contact layer (20) and having a doping concentration higher than the lightly doped contact layer (20);

the process being further characterized by:

forming a wide recess (23) to penetrate the highly doped contact layer (21) so as to expose a surface of the lightly doped contact layer (20); and forming a narrow recess (24) in the wide recess (23) to penetrate the lightly doped contact layer (20) so as to expose a surface of the Schottky layer (18);

wherein the gate electrode (6) is formed in the narrow recess (24) and in Schottky contact with the Schottky layer (18) to extend from the exposed surface of the Schottky layer (18) through the lightly and highly doped contact layers (20, 21);

the source and drain electrodes (4, 5) are formed on, and in ohmic contact with the highly doped contact layer (21) outside the wide recess (23) so that the wide recess (23) is arranged between the source and drain electrodes (4, 5); and wherein the first electron supply layer (12, 13) includes: an undoped wide-bandgap layer (12) formed on the superlattice layer (11); and a doped silicon layer (13) formed on the undoped wide-bandgap layer (12).

35. The process of claim 34, wherein the undoped wide-bandgap layer (12) is formed of AlGaAs and contains aluminum approximately ranging from 22% to 24% by mole ratio.

* * * * *